(12) United States Patent
Hu

(10) Patent No.: US 12,550,758 B1
(45) Date of Patent: Feb. 10, 2026

(54) SUBSTRATE AND MANUFACTURING METHOD THEREOF

(71) Applicant: Dyi-Chung Hu, Hsinchu County (TW)

(72) Inventor: Dyi-Chung Hu, Hsinchu County (TW)

( * ) Notice: Subject to any disclaimer, the term of this patent is extended or adjusted under 35 U.S.C. 154(b) by 0 days.

(21) Appl. No.: 19/004,392

(22) Filed: Dec. 29, 2024

(51) Int. Cl.
  *H01L 23/44* (2006.01)
  *H01L 21/48* (2006.01)
  *H01L 23/427* (2006.01)
  *H01L 23/498* (2006.01)
  *H01L 23/538* (2006.01)

(52) U.S. Cl.
  CPC ........ *H01L 23/5384* (2013.01); *H01L 21/486* (2013.01); *H01L 23/498* (2013.01)

(58) Field of Classification Search
  CPC .. H01L 23/5384; H01L 23/498; H01L 21/486
  See application file for complete search history.

(56) References Cited

U.S. PATENT DOCUMENTS

2015/0156862 A1* 6/2015 Scannel ............... H05K 1/0206
  174/262

OTHER PUBLICATIONS

Machine English Translation of JP 2005243831, Urashima K., published Sep. 8, 2005.*

* cited by examiner

*Primary Examiner* — Peniel M Gumedzoe
(74) *Attorney, Agent, or Firm* — JCIPRNET

(57) ABSTRACT

A substrate includes a first TGV unit and a second TGV unit. The second TGV unit is bonded to the first TGV unit. The first TGV unit is electrically connected to the second TGV unit, and a directly bonding interface including a glass-to-glass bonding interface and a metal-to-metal bonding interface is located between the first TGV unit and the second TGV unit. A manufacturing method of a substrate is also provided.

21 Claims, 21 Drawing Sheets

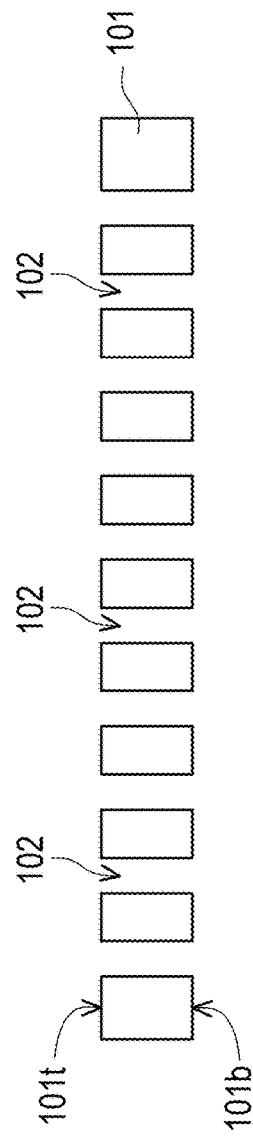
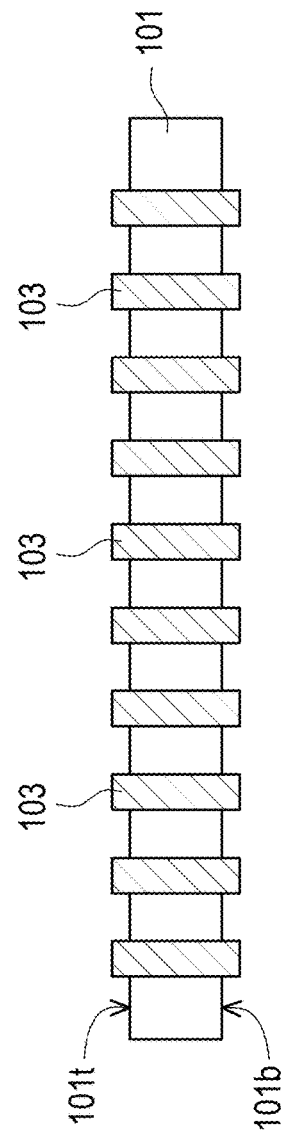
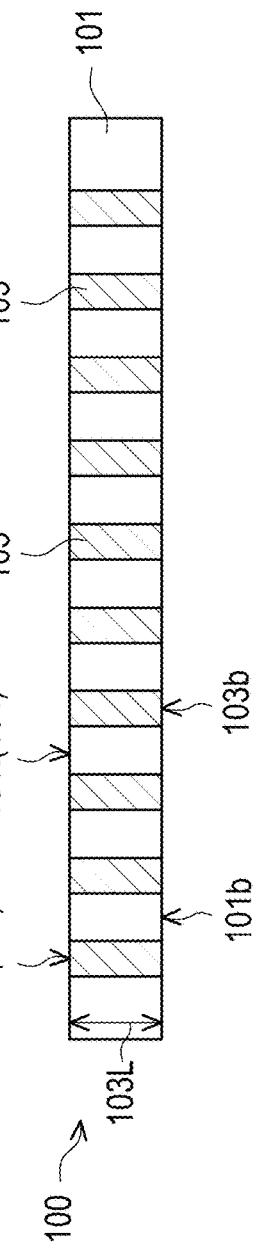
FIG. 1
FIG. 2
FIG. 3

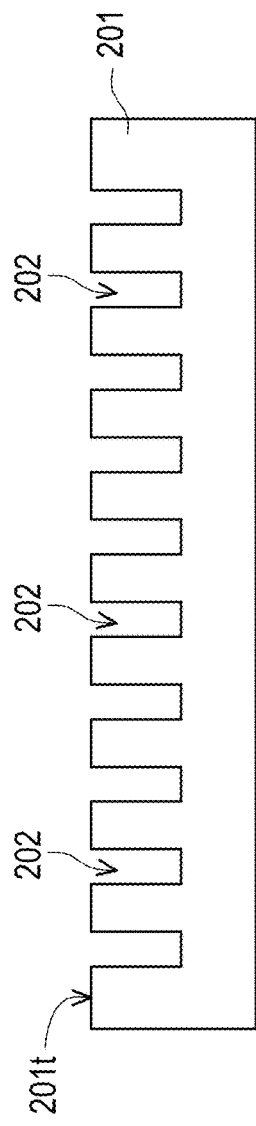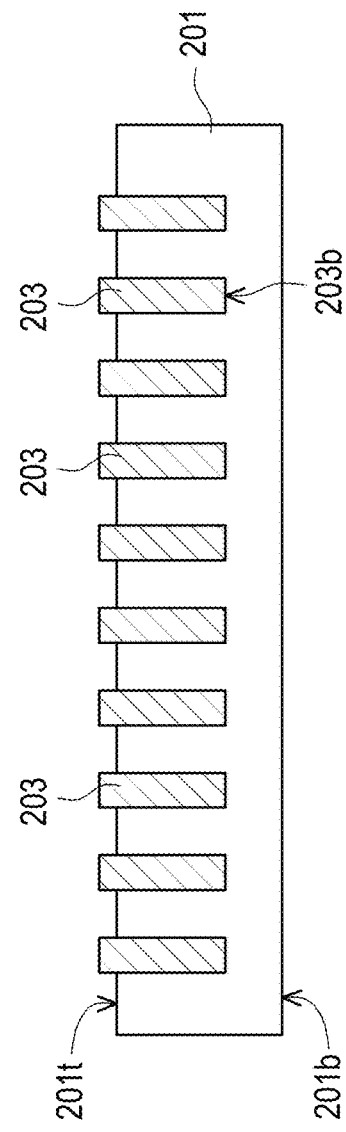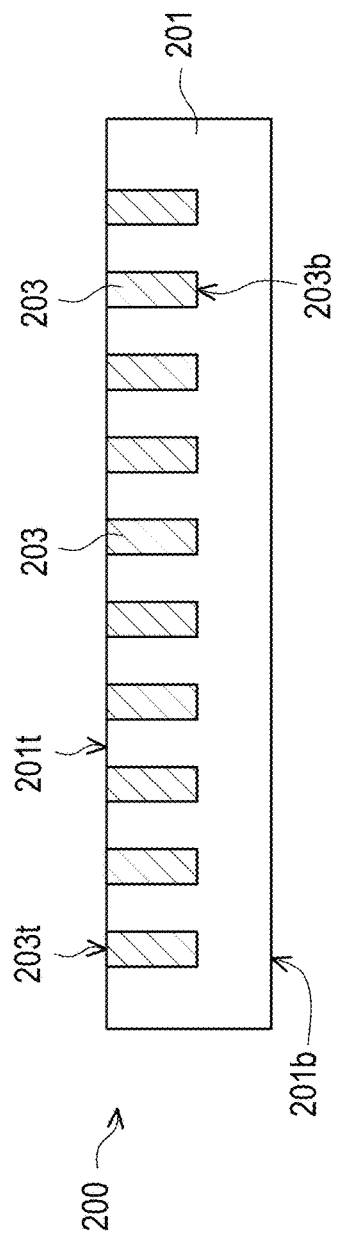

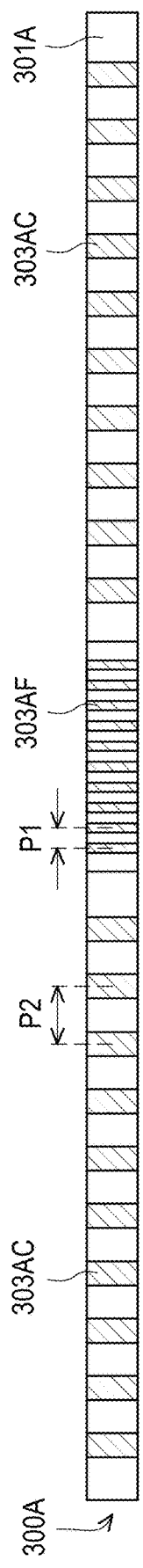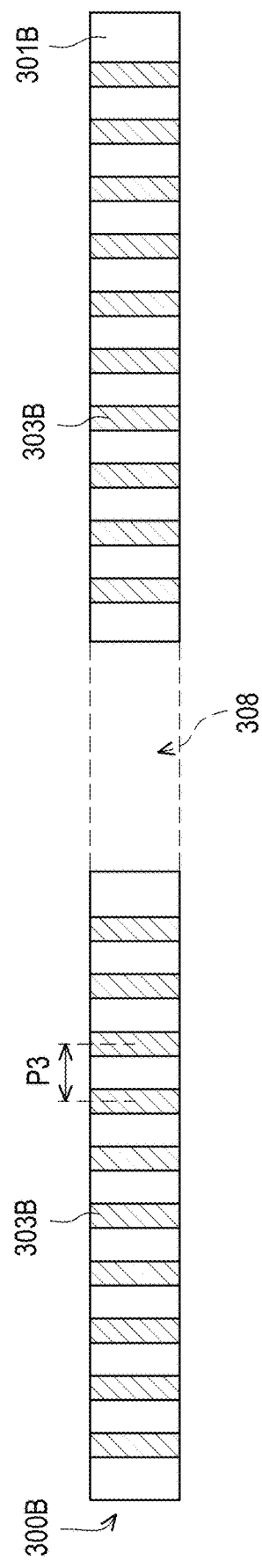
FIG. 17
FIG. 18

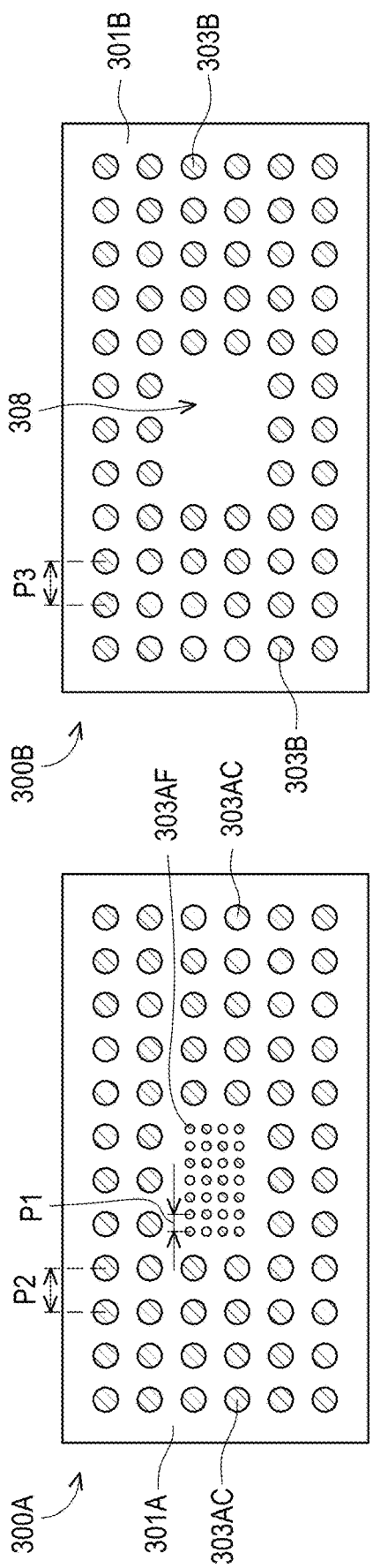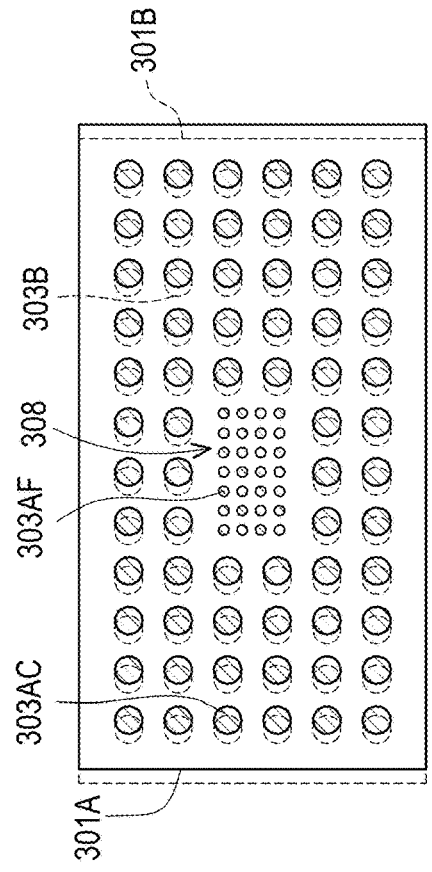
FIG. 20
FIG. 21
FIG. 22

SUBSTRATE AND MANUFACTURING METHOD THEREOF

BACKGROUND

Technical Field

The disclosure is related to a substrate and manufacturing method thereof.

Description of Related Art

In order to meet the needs of the product for better application, the design of substrate has become a challenge to researchers in the field. For example, how to improve the aspect ratio issue in the edge (through hole) of the substrate is important.

SUMMARY

This disclosure provides a substrate and manufacturing method thereof, which can improve the aspect ratio issue thereof.

A glass substrate includes a first TGV (through glass via) unit and a second TGV unit. The second TGV unit is bonded to the first TGV unit. The first TGV unit is electrically connected to the second TGV unit, and a directly bonding interface including a glass-to-glass bonding interface and a metal-to-metal bonding interface is located between the first TGV unit and the second TGV unit.

A manufacturing method of a substrate includes: providing a first TGV unit and a second TGV unit; connecting the first TGV unit and the second TGV unit; and performing a thermal compression process, such that the first TGV unit and the second TGV unit are directly bonded to each other.

To sum up, in this disclosure, the core layer of the substrate assembled by two separated TGV units may have a higher aspect ratio, such that the challenging high aspect ratio issue may can be overcome. As a result, it will improving the yields and the electrical performance in subsequent applications of the substrate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1 to FIG. 8 are partial schematic cross-sectional views illustrating a manufacturing method of a substrate according to some embodiments of the disclosure.

FIG. 10 to FIG. 16 are partial schematic cross-sectional views illustrating a manufacturing method of a substrate according to some embodiments of the disclosure.

FIG. 17 to FIG. 19 are partial schematic cross-sectional views illustrating a manufacturing method of a substrate according to some embodiments of the disclosure.

FIG. 20 to FIG. 22 are partial schematic top views illustrating a manufacturing method of a substrate according to some embodiments of the disclosure.

DESCRIPTION OF THE EMBODIMENTS

Figure 4:
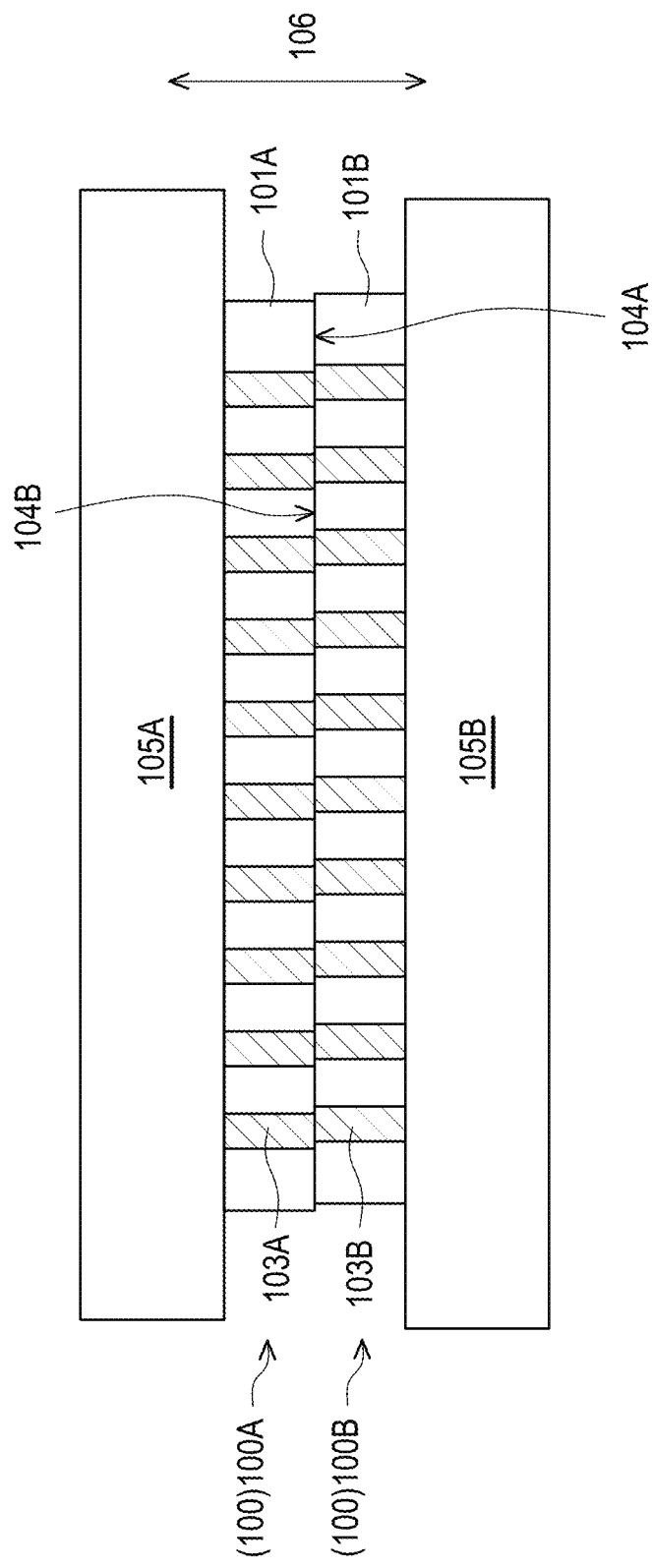

Exemplary embodiments of the disclosure are described below comprehensively with reference to the figures, but the disclosure may also be implemented in different ways and should not be construed as limited to the embodiments described herein. In the drawings, for the sake of clarity, the size and thickness of various regions, parts, and layers may not be drawn to actual scale. In order to facilitate understanding, the same elements in the following description are described with the same symbols.

The disclosure is more comprehensively described with reference to the figures of this embodiment. However, the disclosure may also be implemented in various different forms, and is not limited to the embodiments in the present specification. Thicknesses, dimensions, and sizes of layers or regions in the drawings are exaggerated for clarity. The same reference numbers are used in the drawings and the description to indicate the same or like parts, which are not repeated in the following embodiments.

Directional terms (for example, upper, lower, right, left, front, back, top, and bottom) used herein only refer to the graphical use, and are not intended to imply absolute orientation.

It should be understood that, although the terms "first", "second", "third", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion.

Unless otherwise defined, all terms (including technical and scientific terms) used herein have the same meaning as that commonly understood by one of ordinary skill in the art to which this disclosure belongs.

Unless otherwise stated, the term "range from" used in the specification to define a value range is intended to cover a range equal to and between the stated endpoint values. For example, a size range ranges from a first value to a second value means that the size range may cover the first value, the second value, and any value between the first value and the second value.

FIG. 1 to FIG. 8 are partial schematic cross-sectional views illustrating a manufacturing method of a substrate according to some embodiments of the disclosure. FIG. 9 is a partial schematic top view of bonding between the first conductive connector and the second conductive connector according to some embodiments of the disclosure.

According to property of the material, the glass transition temperature (Tg) of glass is higher than the glass transition temperature of organic material, therefore the glass core substrate may be process and operate at a higher temperature, for example, the organic core substrate may only operate at temperature below 250° C., and the glass core substrate may operate exceed 400° C. In addition, the organic core substrate with fiberglass, fillers, etc., such that the surface is not flat, and making fine lines on top of the organic substrate is very challenge significantly below 10 ums, in contrast, the surface roughness (Ra) of the glass may be as smooth down to a few nanometers, thereby making fine lines on top of the glass core substrate is possible. Moreover, the organic core substrate may be limited to size around 500 mm, and glass core substrate may be cost effect for bigger format process, in some embodiments, glass core substrate can be with large format 1000 mm is feasible. based on these advantages, the glass layer (not organic core substrate) is more competitive.

Referring to FIG. 1, first, a glass layer 101 is provided. And then, portions of the glass layer 101 are removed to form a plurality of through vias 102, for example, a top surface 101t and a bottom surface 101b of the glass layer 101 is penetrated by the through vias 102. In some embodiments, the removal process is by laser modification followed by a chemical etching process with an etchant, wherein the etchant includes hydrogen fluoride or the like, but the disclosure is not limited thereto, other suitable process may be used.

Referring to FIG. 2, a plurality of conductive connectors 103 are formed in the through vias 102 and over the glass layer 101. In some embodiments, the conductive connectors 103 may be formed by a first seed layer process such as sputtering, atomic layer deposition, or electroless plating with copper seed layer or the like. Followed by the chemical plating of the copper to fill the via hole. Further, the conductive connectors 103 may be protruded from the top surface 101t and the bottom surface 101b of the glass layer 101 to outside respectively for ensuring the whole space in the through vias 102 filled up the conductive material of the conductive connectors 103, thereby the electrical performance is improved, but the disclosure is not limited thereto.

In some embodiments, before the formation of the conductive connectors 103, an additional titanium (Ti) seed layer (not shown) may be formed through the seed layer process, but the disclosure is not limited thereto.

Referring to FIG. 3, a planarization process, such as a chemical mechanical polishing (CMP) process or the like, is performed on the glass layer 101 and the conductive connectors 103, thereby flatness of a bonding surface 104 (such as configured by the top surface 101t of the glass layer 101 and top surfaces 103t of the conductive connectors 103) is improved. The top surface 101t of the glass layer 101 and top surfaces 103t of the conductive connectors 103 may be coplanar, and the bottom surface 101b of the glass layer 101 and bottom surfaces 103b of the conductive connectors 103 also may be coplanar after the planarization process. By doing so, the subsequent bonding quality can be improved. In unillustrated embodiment, the bonding surface 104 may be configured by the bottom surface 101b of the glass layer 101 and bottom surfaces 103b of the conductive connectors 103.

After the above-mentioned manufacturing process, the manufacturing of a TGV unit 100 including the glass layer 101 and the conductive connectors 103 of the present embodiment is substantially completed. Herein, a length 103L of each of the conductive connectors 103 may be about 500 μm (micrometer) or other suitable value, but the disclosure is not limited thereto.

Referring to FIG. 4, for clear description as follow, two TGV units 100 are provided, wherein an upper one of the two TGV units 100 may be referred to a first TGV unit 100A and a bottom one of the two TGV units 100 may be referred to a second TGV unit 100B. Further, an upper one of the two glass layer 101 may be referred to a first glass layer 101A and a bottom one of the two glass layer 101 may be referred to a second glass layer 101B. Moreover, an upper set of the two set of conductive connectors 103 may be referred to first conductive connectors 103A and a bottom set of the two set of conductive connectors 103 may be referred to second conductive connectors 103B. Herein, the first TGV unit 100A and the second TGV unit 100B are entire through via type respectively.

In FIG. 4, the first unit 100A and the second unit 100B are connected (may be at room temperature) and an upper supported block 105A may be disposed on the first TGV unit 100A and a bottom supported block 105B may be disposed on the second TGV unit 100B, such that the first TGV unit 100A and the second TGV unit 100B may be interposed between the upper supported block 105A and the bottom supported block 105B for further ensuring the flatness in the subsequent bonding process. In some embodiments, the upper supported block 105A and the bottom supported block 105B may be metal block or the like.

Referring to FIG. 4, the first TGV unit 100A and the second TGV unit 100B are aligned with alignment accuracy of the bonding tool in an orthographic projection direction 106, for example, the first conductive connector 103A and the second conductive connector 103B opposite to each other may be not entirely overlapped, and a first bonding surface 104A of the first TGV unit 100A and a second bonding surface 104B of second TGV unit 100B may be laterally offset, but the disclosure is not limited thereto.

Figure 5:
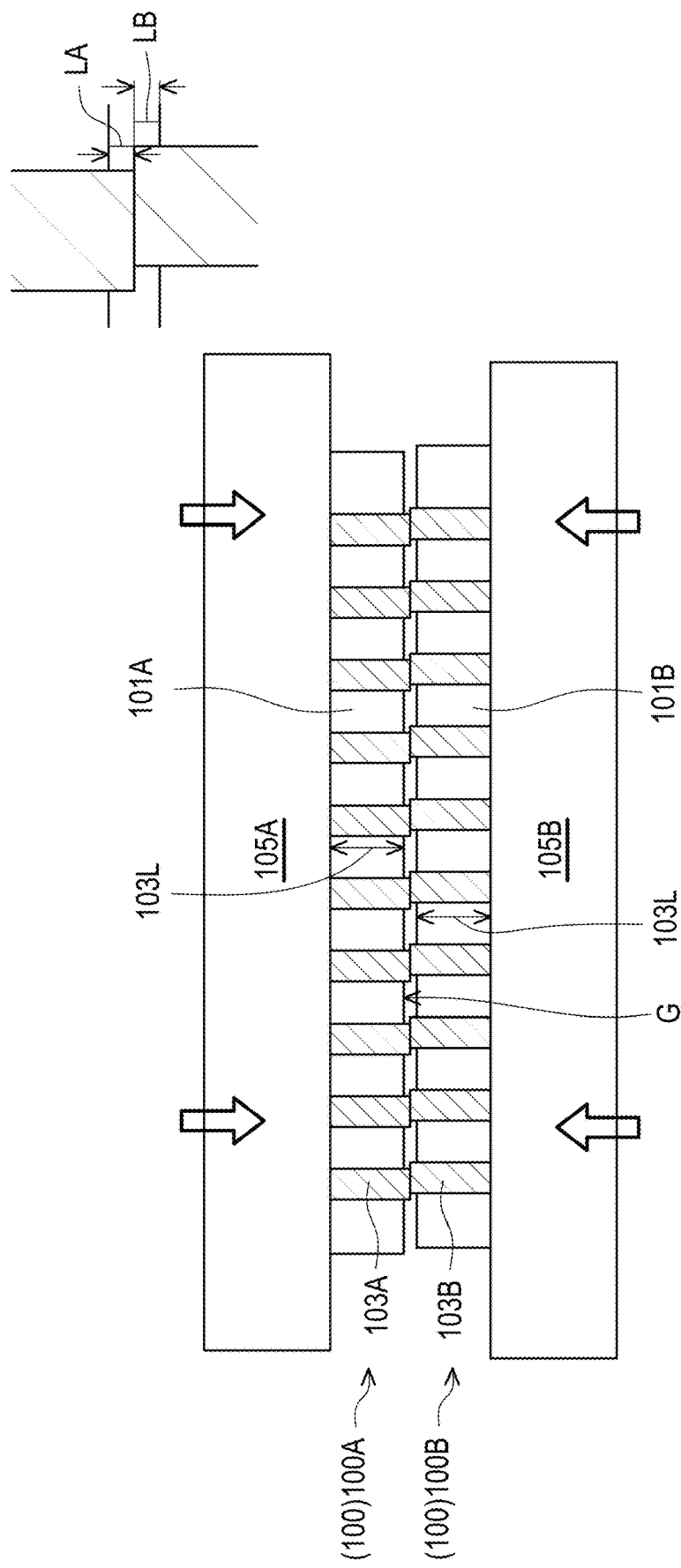

Referring to FIG. 5, after connection of the first unit 100A and the second unit 100B, a thermal compression bonding process is performed. For example, the first conductive connectors 103A and the second conductive connectors 103B are under heat and pressure as shown in arrow of FIG. 5 during the thermal compression bonding process, such that the first conductive connectors 103A are protruded from the first glass layer 101A toward to the second TGV unit 100B, and the second conductive connectors 103B are protruded from the second glass layer 101B toward to the first TGV unit 100A during the thermal compression bonding process, meanwhile gaps G are formed between the first glass layer 101A and the second glass layer 101B.

In some embodiments, compared to organic core substrate, since materials of the conductive connector and the glass layer have a high glass transition temperature (Tg), an operated temperature of the hot-pressing process ranges from 250° C. to 500° C. and/or an operated pressure of the thermal compression bonding process ranges from 1 atm to 10 atm may be feasible. Moreover, an environment of the hot-pressing process may be free of oxygen for avoiding other defects, but the disclosure is not limited thereto.

In some embodiments, the different coefficient of thermal expansion (CTE) between the first conductive connectors 103A and the first glass layer 101A may cause a first exposed length LA of each of the first conductive connectors 103A, and the different coefficient of thermal expansion between the second conductive connectors 103B and the second glass layer 101B may cause a second exposed length LB of each of the second conductive connectors 103B.

In present embodiment, since materials of the first conductive connectors 103A are same as materials of the second conductive connectors 103B, the first exposed length LA may be substantially same as the second exposed length LB, for example, when the operated temperature is 425° C., the first exposed length LA and the second exposed length LB may be 2.8 micrometers respectively, but the disclosure is not limited thereto.

In some embodiments, a length of embedded portions of the first conductive connector 103A located in the first glass layer 101A, and a length of embedded portions of the second conductive connector 103B located in the second glass layer 101B are same as the length 103L in FIG. 3, but the disclosure is not limited thereto.

Figure 6:
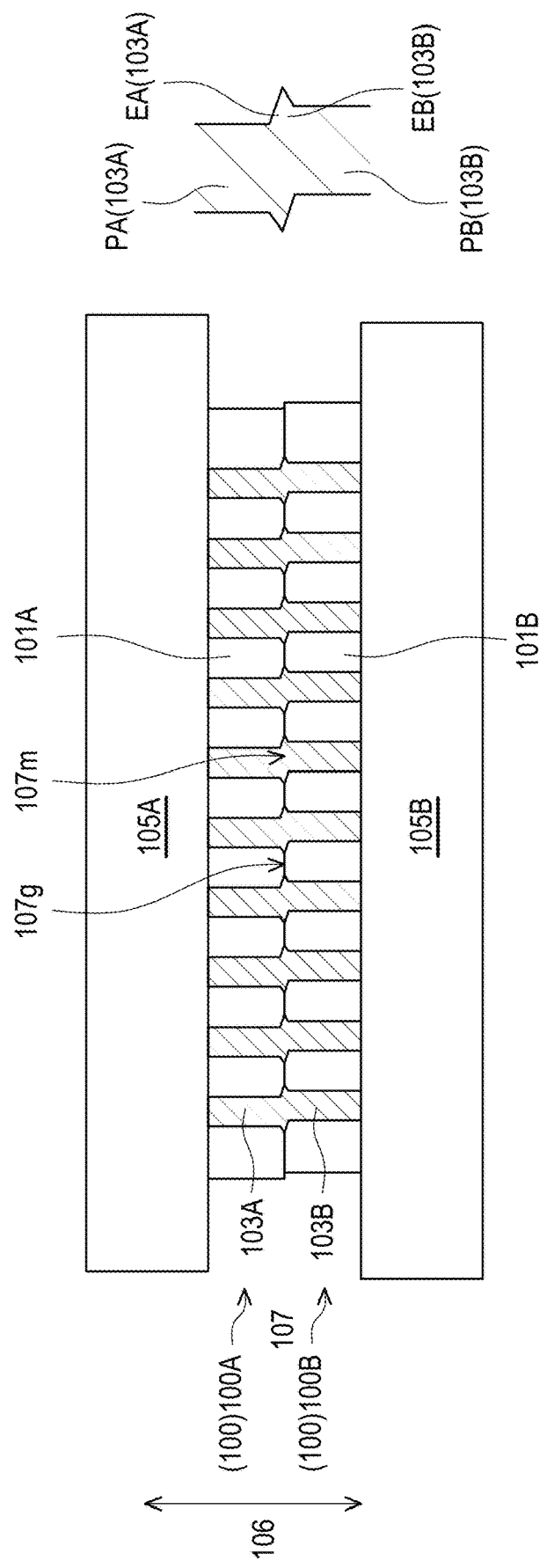

Referring to FIG. 6, after performing the hot-pressing process, the first TGV unit 100A and the second TGV unit 100B are directly bonded to each other, therefore, the first TGV unit 100A is electrically connected to the second TGV unit 100B, and a directly bonding interface 107 including a glass-to-glass bonding interface 107g and a metal-to-metal bonding interface 107m is located between the first TGV unit 100A and the second TGV unit 100B. Herein, the high temperature promote the bonding of two glass layers (the first glass layer 101A and the second glass layer 101B) and the bonding of two conductive connectors (the first conductive connector 103A and the second conductive connector 103B).

For example, the first conductive connectors 103A and the second conductive connectors 103B are squeezed and flowed to the surface of the first glass layer 101A and the surface of the second glass layer 101B during the thermal compression process, thereby the first conductive connectors 103A and the second conductive connectors 103B are deformed to form a metallurgical bonding in the orthographic projection direction 106.

In FIG. 6, each of the first conductive connectors 103A includes a first enlarged portion EA and a first pillar portion PA, each of the second conductive connectors 103B includes a second enlarged portion EB and a second pillar portion PB. In this manner, the directly bonding interface 107 is configured by the first enlarged portion EA, first glass layer 101A, the second enlarged portion EB, and the second glass layer 101B, that is to say, the first glass layer 101A is directly in contact with the second glass layer 101B, and the first enlarged portion EA is directly in contact with the second enlarged portion EB.

In some embodiments, the first enlarged portion EA is gradually increased in a direction toward the directly bonding interface 107, and the second enlarged portion EB is gradually increased in a direction toward the directly bonding interface 107, such that a size of the first enlarged portion EA is larger than a size of the first pillar portion PA, and a size of the second enlarged portion EB is larger than a size of the second pillar portion PB.

Further, after bonding process, the first pillar portion PA and the second pillar portion PB opposite to each other are not entirely overlapped, thereby a bonding area (overlapped area and non-overlapped area) between the first TGV unit 100 and the second TGV unit 200 is larger than a diameter D1 of the first pillar portion PA or a diameter D2 of the second pillar portion PB, as shown in FIG. 9.

Figure 7:
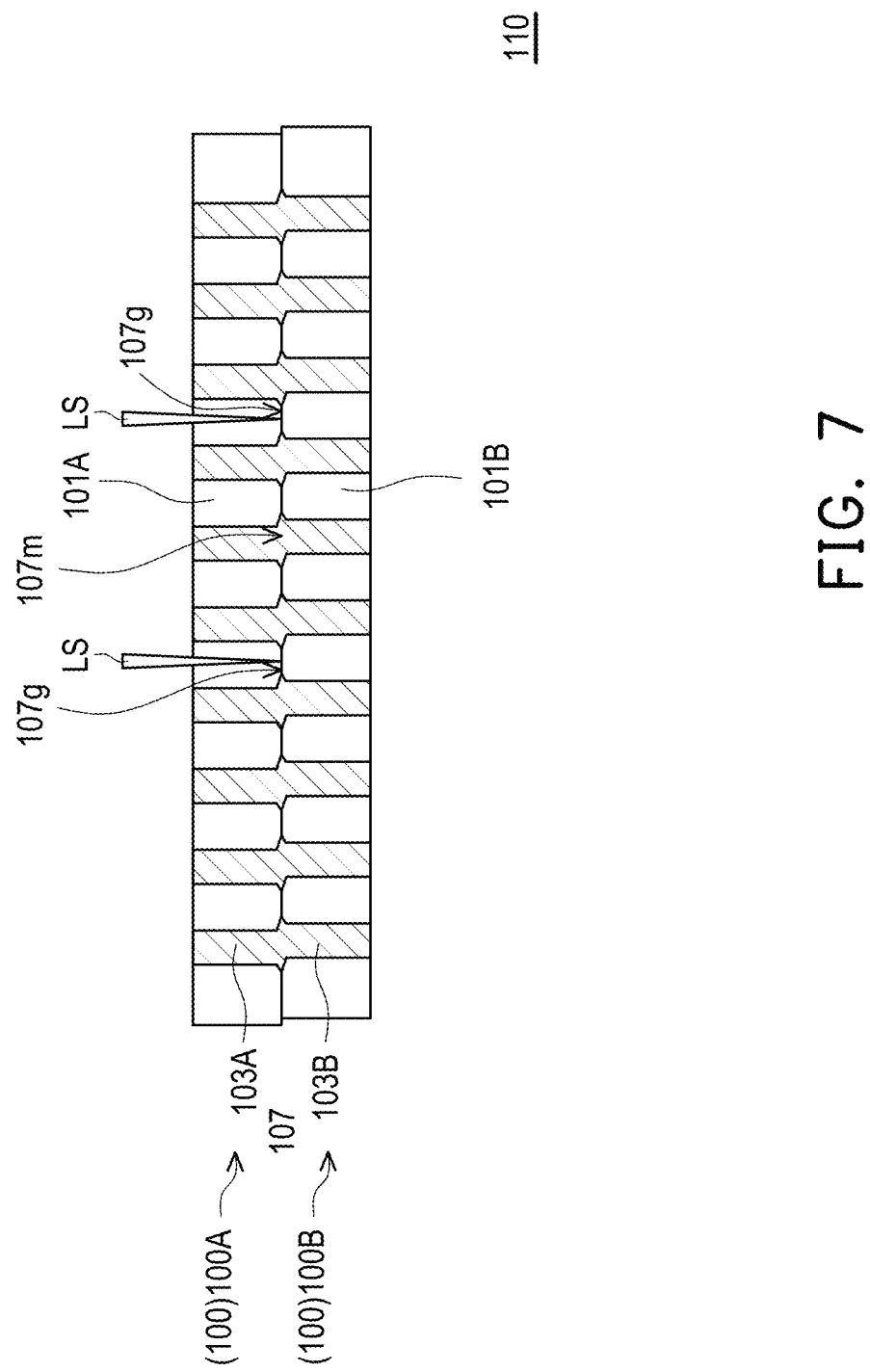

Referring to FIG. 7, after bonding the first TGV unit 100A and the second TGV unit 100B, the upper supported block 105A and the bottom supported block 105B may be removed by suitable process. And then, a laser beam welding process LS is performed on the glass-to-glass bonding interface 107g of the directly bonding interface 107, by doing so, the bonding strength between the first glass layer 101A and the second glass layer 101B may be further improved. Herein, the detail of the laser beam welding process LS may be determined according to actual design requirements, the disclosure is not limited thereto.

After the above-mentioned manufacturing process, the manufacturing of a core layer 110 including the first TGV unit 100A and the second TGV unit 100B is substantially completed. Accordingly, the core layer 110 of the substrate assembling by two separated TGV units may have the high aspect ratio, such that the aspect ratio issue may be improve. As a result, it will improving the yields and the electrical performance in subsequent applications of the substrate. Herein, the aspect ratio of the core layer 110 is the length of the conductive connector divided by the diameter of the conductive connector (aspect ratio=L/D).

Figure 8:
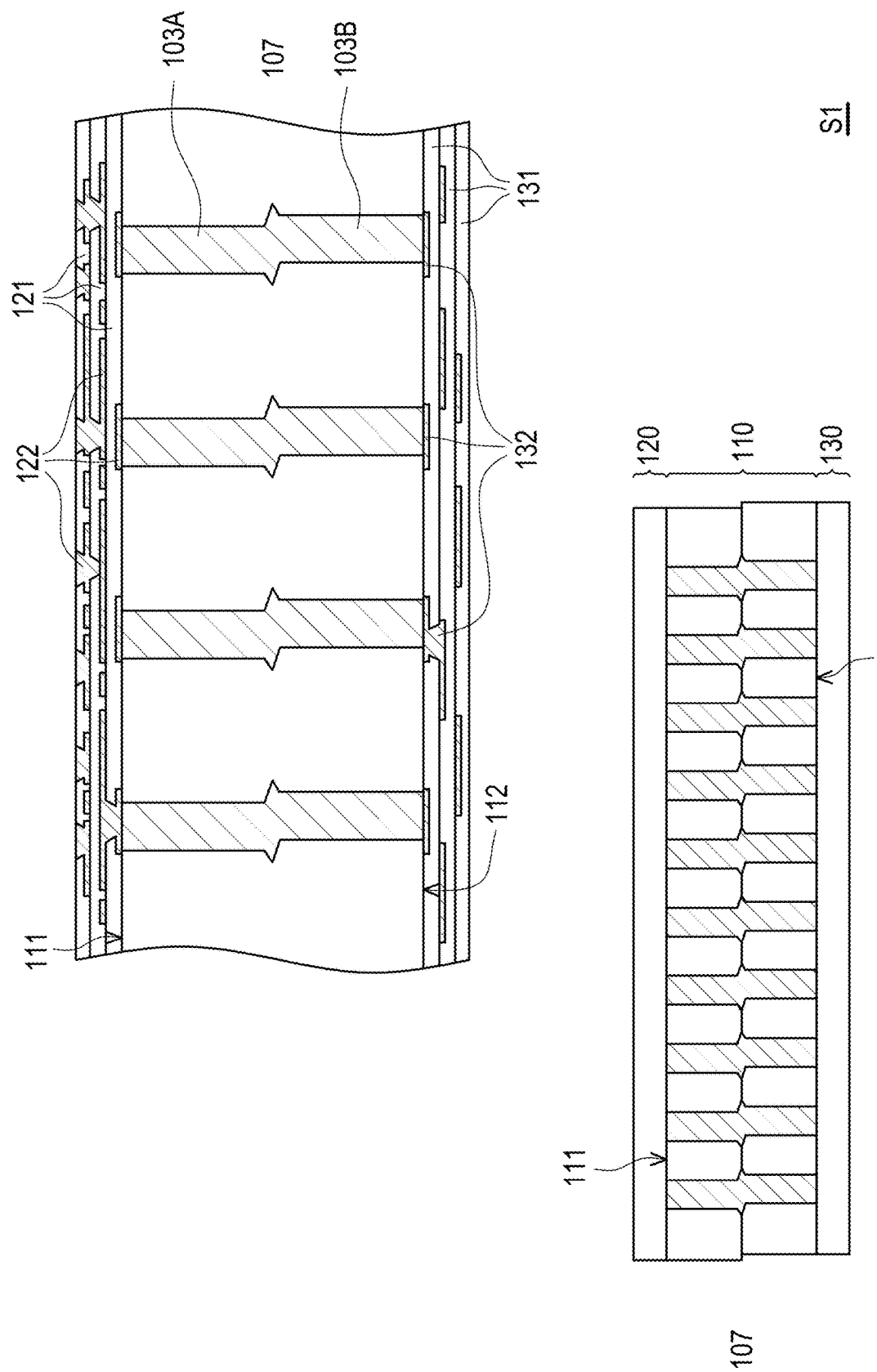
Figure 9:
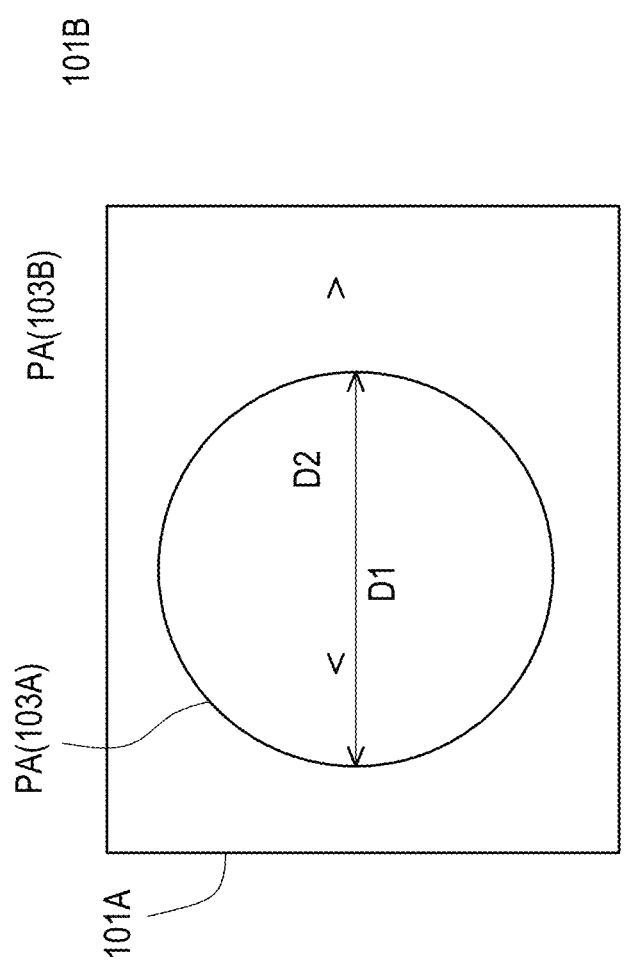
FIG. 9 is a partial schematic top view of bonding between the first conductive connector and the second conductive connector according to some embodiments of the disclosure.

Referring to FIG. 8, a first circuit structure 120 is formed on the top surface 111 of the core layer 110 and a second circuit structure 130 is formed on the bottom surface 112 of the core layer 110 respectively to form a substrate S1, wherein the first circuit structure 120 and the second circuit structure 130 are disposed on two opposite sides of the core layer 110, and the conductive connectors 103A, 103B may provide a vertical conductive path between the first circuit structure 120 and the second circuit structure 130. In FIG. 8, the core layer 110 is thicker than the first circuit structure 120 and the second circuit structure 130.

As shown in the enlarge portion of FIG. 8, the first circuit structure 120 and the second circuit structure 130 may be referred to as redistribution structures or build-up structures including dielectric layer and conductive layers. For example, a plurality of first dielectric layers 121 of the first circuit structure 120 and a plurality of second dielectric layers 131 of the second circuit structure 130 are formed by laminating dielectric material (such as ABF, PP, or the like) over a formed conductive layer (such as copper or the like) or the core layer 110, and a plurality of first conductive layers 122 of the first circuit structure 120 and a plurality of second conductive layers 132 of the second circuit structure 130 are respectively formed on the first dielectric layers 121 and the second dielectric layers 131. The dielectric layers (e.g., 121, 131) in the build-up structures insulate the conductive layer (e.g., 122, 132), from conductive traces underneath the dielectric layer (e.g., 121, 131). Herein the first circuit structure 120 and the second circuit structure 130 may be formed by suitable processes (such as photolithography, etch, or the like), the disclosure is not limited thereto.

Figure 24:
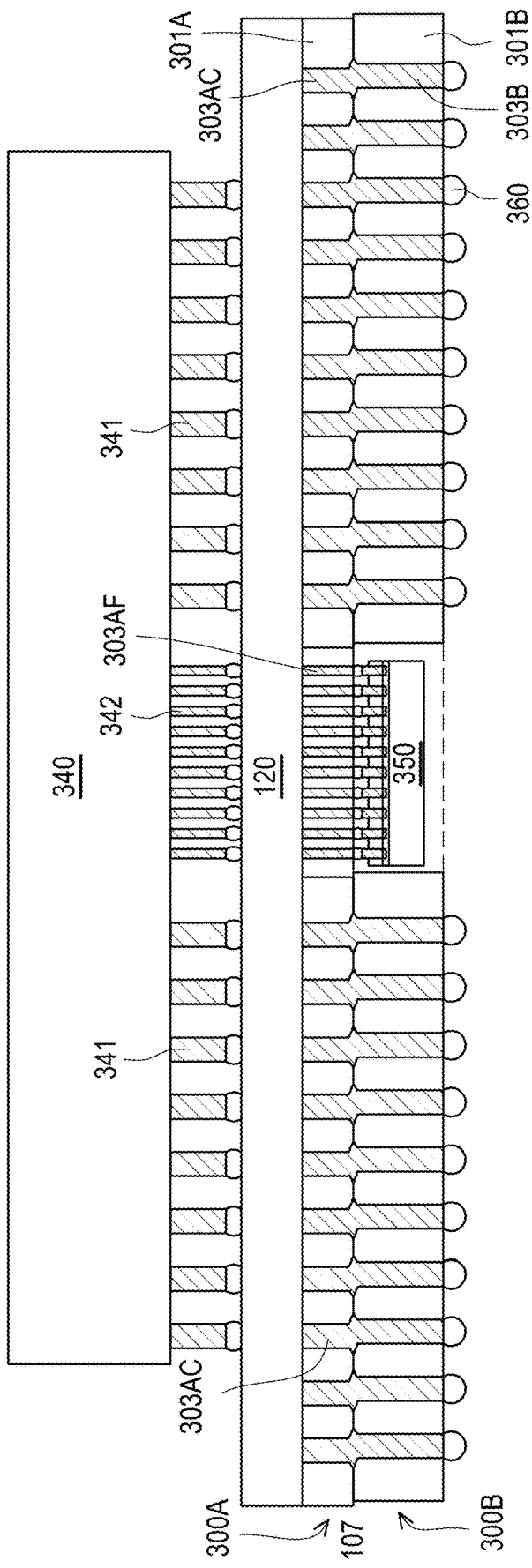

It should be noted that, the above detail description may be not shown in FIG. 24 for clarity, the entirety of each of the above-mentioned is hereby incorporated in FIG. 24 and made a part of this figure.

In some embodiments, the conductive elements (e.g., conductive patterns, conductive vias, conductive lines, or conductive pads) of the first conductive layers 122 are finer than the conductive elements (e.g., conductive patterns, conductive vias, conductive lines, or conductive pads) of the second conductive layers 132, thereby chip may be bonded on the first circuit structure 120 and external terminals may be bonded on the second circuit structure 130 (not shown), but the disclosure is not limited thereto. In some embodiments, the contact density of the first circuit structure 120 is denser than the contact density of the second circuit structure 130, the disclosure is not limited thereto.

It is to be noted that the following embodiments use the reference numerals and a part of the contents of the above embodiment, and the same or similar reference numerals are used to denote the same or similar elements, and the description of the same technical content is omitted. For the description of the omitted part, reference may be made to the above embodiments, and details are not described in the following embodiments.

FIG. 10 to FIG. 16 are partial schematic cross-sectional views illustrating a manufacturing method of a substrate according to some embodiments of the disclosure, wherein this embodiment is another manufacturing method of the core layer 110 of the substrate S1.

Referring to FIG. 10, similar to FIG. 1, a structure of FIG. 10 is different from a structure of FIG. 1 in the following: a top surface 201t and a bottom surface 201b of the glass layer 201 are not entirely penetrated by the through vias 202. For example, the through vias 202 are not extended to the bottom surface 201b of the glass layer 201, such that the first TGV unit 200A and the second TGV unit 200B may be partial through via type respectively.

Referring to FIG. 11, similar to FIG. 2, a structure of FIG. 11 is different from a structure of FIG. 2 in the following: the conductive connectors 103 only protruded from the top surface 101t of the glass layer 101, and bottom surfaces 203b of the conductive connectors 203 may be surrounded by the glass layer 201.

Referring to FIG. 12, similar to FIG. 3, a structure of FIG. 12 is different from a structure of FIG. 3 in the following: the planarization process is only performed on the top surface 201t of the glass layer 201 and top surfaces 203t of the conductive connectors 203, such that the top surface 201t of the glass layer 201 and top surfaces 203t of the conductive connectors 203 may be coplanar, and the bottom surface 201b of the glass layer 201 and the bottom surfaces 203b of the conductive connectors 203 may not be coplanar.

Figure 13:
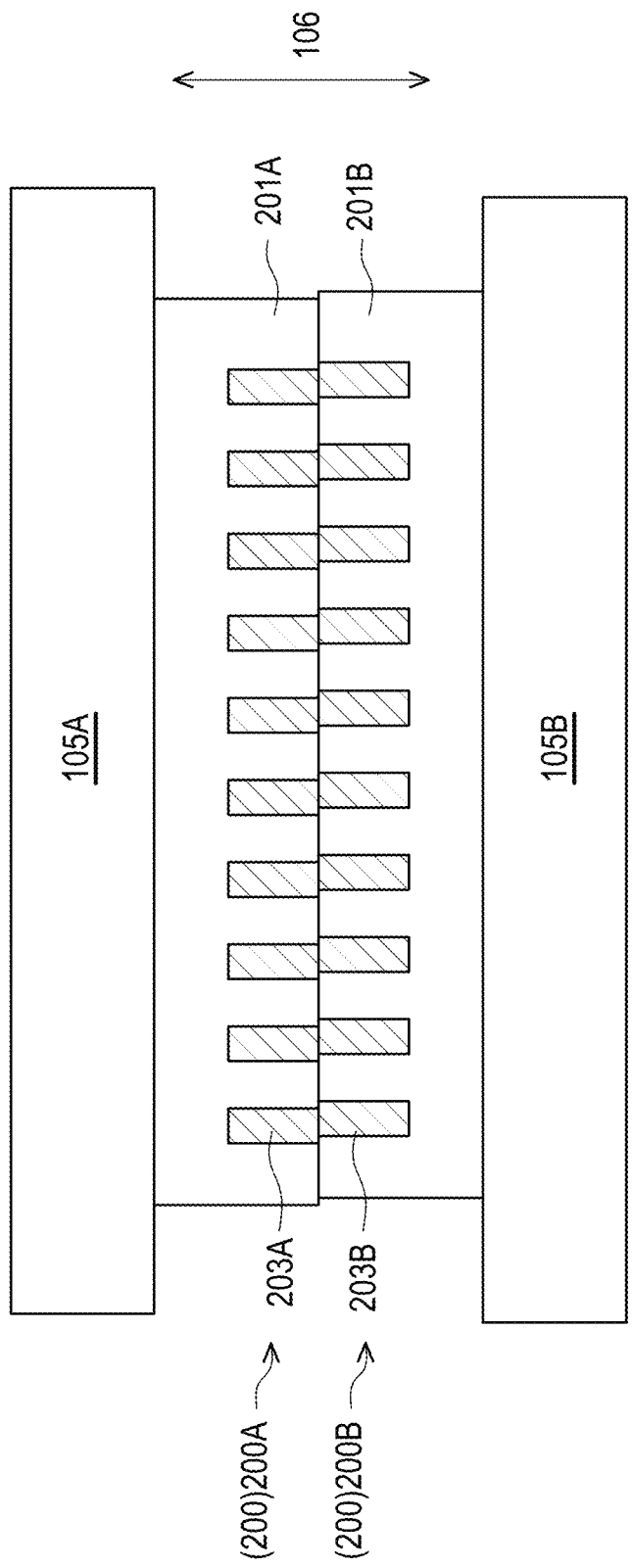
Figure 14:
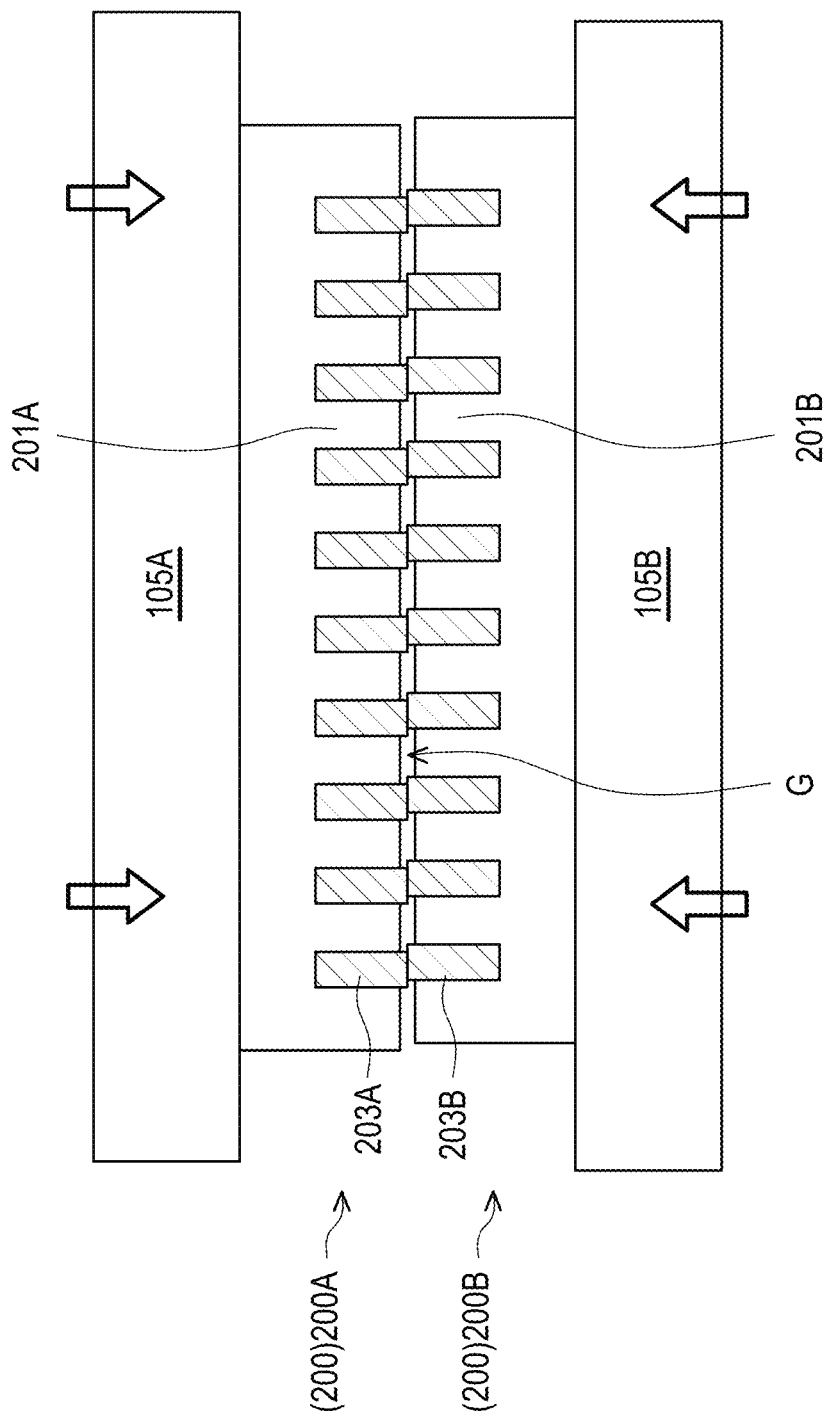
Figure 15:
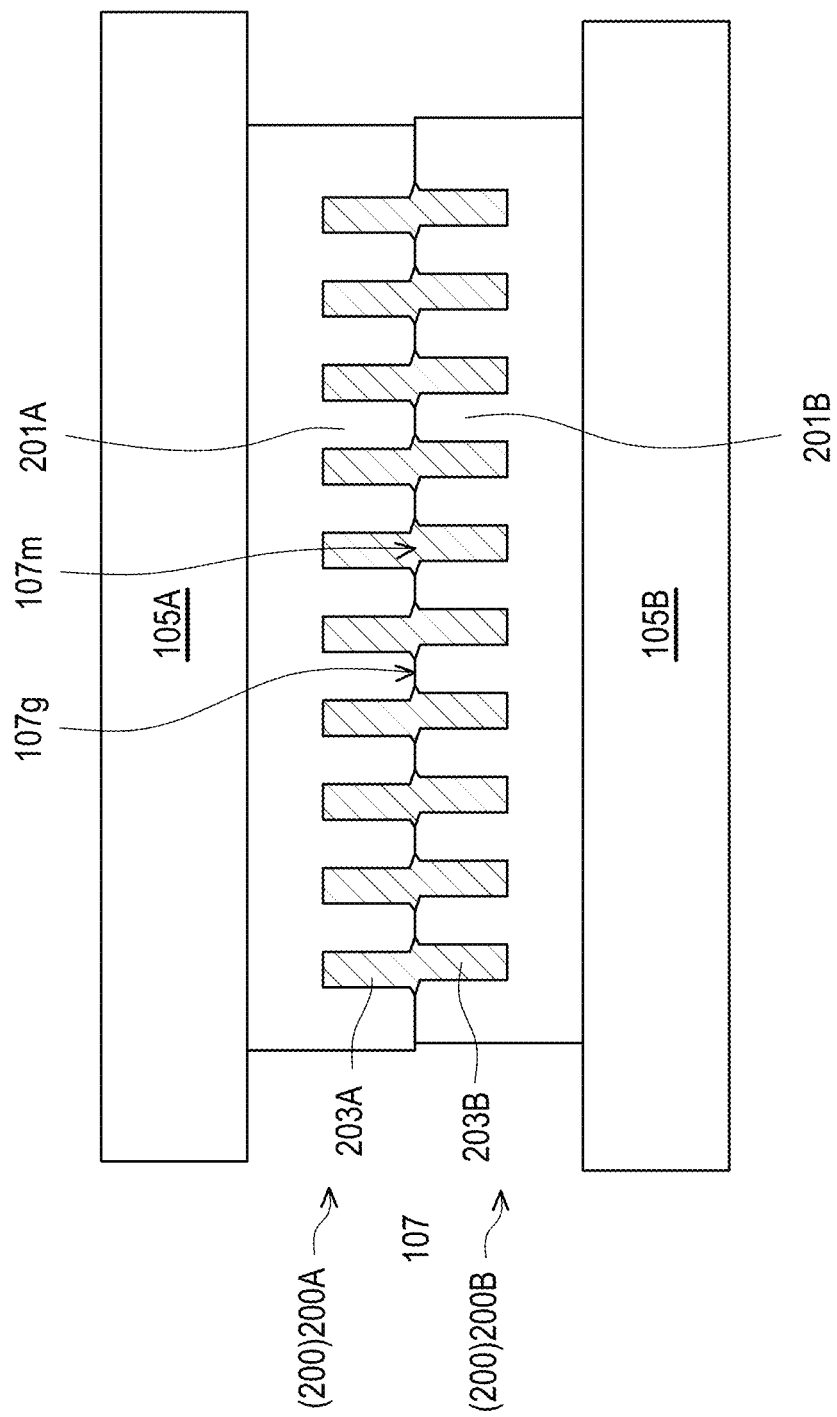

Referring to FIG. 13 to FIG. 15, similar to FIG. 4 to FIG. 6, a structure of FIG. 13 to FIG. 15 are different from a structure of FIG. 4 to FIG. 6 in the following: two TGV units 200 are provided, wherein an upper one of the two TGV units 200 may be referred to a first TGV unit 200A and a bottom one of the two TGV units 200 may be referred to a second TGV unit 200B. Further, an upper one of the two glass layer 201 may be referred to a first glass layer 201A and a bottom one of the two glass layer 201 may be referred to a second glass layer 201B. Moreover, an upper set of the two set of conductive connectors 203 may be referred to first conductive connectors 203A and a bottom set of the two set of conductive connectors 203 may be referred to second conductive connectors 203B. In addition, the upper supported block 105A and the bottom supported block 105B may not be directly in contact with the first conductive connectors 203A and the second conductive connectors 203B.

After performing the thermal compression bonding process, the first TGV unit 200A and the second TGV unit 200B are directly bonded to each other, therefore, the first TGV unit 200A is electrically connected to the second TGV unit 200B, and a directly bonding interface 107 including a glass-to-glass bonding interface 107g and a metal-to-metal bonding interface 107m is located between the first TGV unit 200A and the second TGV unit 200B, as shown in FIG. 15.

Figure 16:
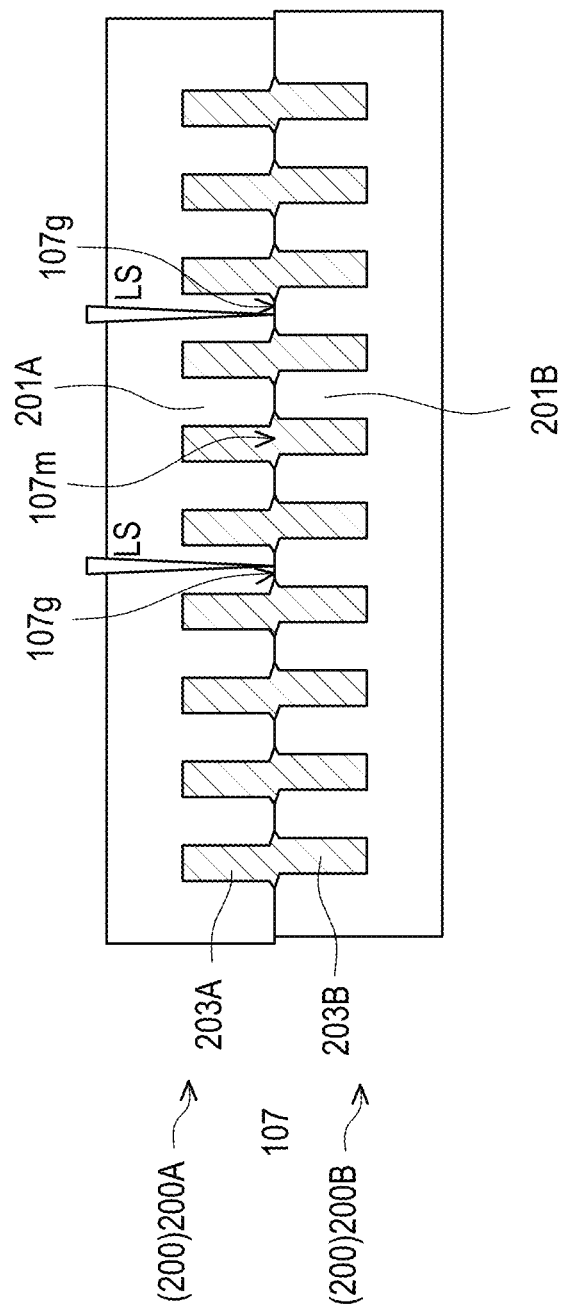

Referring to FIG. 16, similar to FIG. 7, a structure of FIG. 16 is different from a structure of FIG. 7 in the following: after removal of the upper supported block 105A and the bottom supported block 105B, the first conductive connectors 203A and the second conductive connectors 203B are not revealed. Therefore, a thinned process is performed to reveal the first conductive connectors 203A and the second conductive connectors 203B to form the structure of the core layer 110 as shown in FIG. 7. Accordingly, the core layer 110 of the substrate assembling by two separated TGV units may have the high aspect ratio, such that the aspect ratio issue may be improve. As a result, it will have adverse effects on the yields and the electrical performance in subsequent applications of the substrate.

Figure 19:
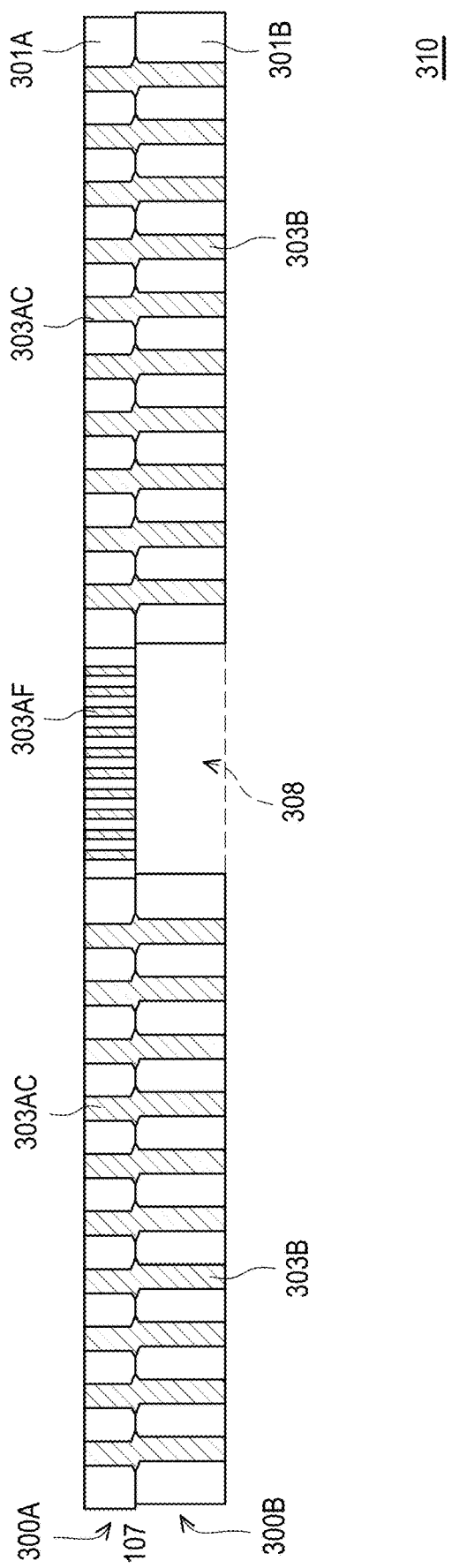
Figure 23:
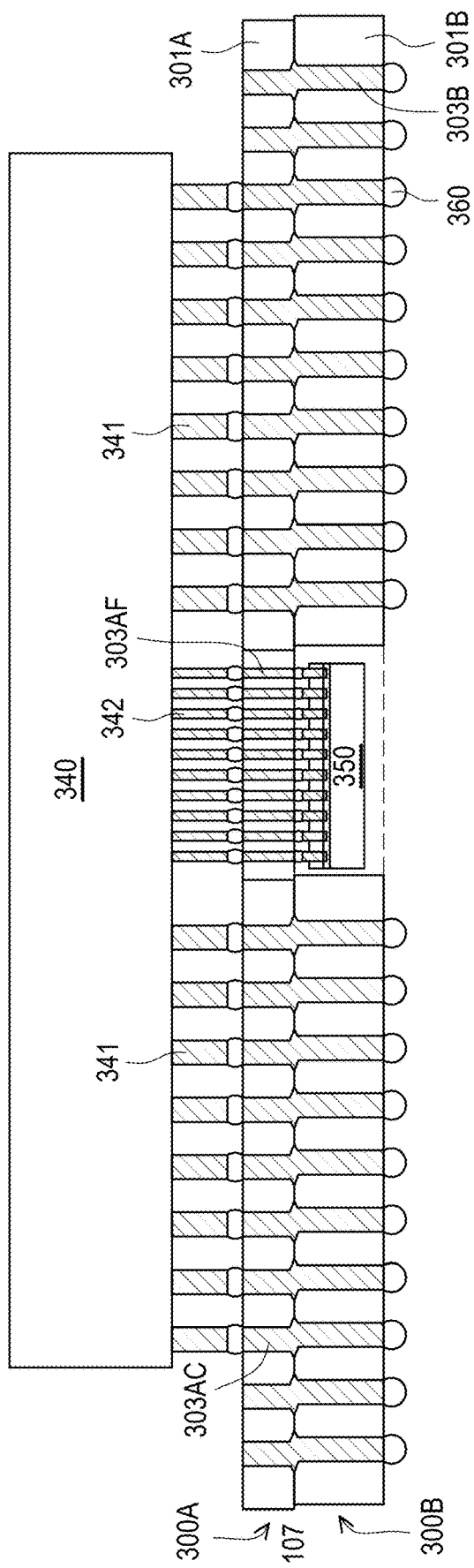
FIG. 23 and FIG. 28 are partial schematic cross-sectional views illustrating an application of a substrate according to some embodiments of the disclosure.

FIG. 17 to FIG. 19 are partial schematic cross-sectional views illustrating a manufacturing method of a substrate according to some embodiments of the disclosure. FIG. 20 to FIG. 22 are partial schematic top views illustrating a manufacturing method of a substrate according to some embodiments of the disclosure, wherein FIG. 20 is corresponded to FIG. 17, FIG. 21 is corresponded to FIG. 18, and FIG. 22 is corresponded to FIG. 19. FIG. 23 and FIG. 24 is partial schematic cross-sectional view illustrating an application of a substrate according to some embodiments of the disclosure.

Referring to FIG. 17, FIG. 18, FIG. 21, and FIG. 22, a first TGV unit 300A and a second TGV unit 300B are provided respectively. Further, the first TGV unit 300A includes a first glass layer 301A, a fine pitch portion 303AF, and a first coarse pitch portion 303AC, wherein the glass layer 301A is penetrated by the fine pitch portion 303AF and the first coarse pitch portion 303AC. On the other hand, the second TGV unit 300B includes a second glass layer 301B, a second coarse pitch portion 303B, and a cavity 308, wherein the second glass layer 301B is penetrated by the second coarse pitch portion 303B and the cavity 308.

The fine pitch portion 303AF is formed between and surrounded by the first coarse pitch portion 303AC, meanwhile the fine pitch portion 303AF includes fine conductive connectors, and the first coarse pitch portion 303AC includes first coarse conductive connectors. For example, a pitch P1 of adjacent of the fine conductive connectors is smaller than a pitch P2 of adjacent of the first coarse conductive connectors, as shown in FIG. 17 and FIG. 21.

In addition, the cavity is formed between and surrounded by the second coarse pitch portion 303B, and the second coarse pitch portion 303B includes second coarse conductive connectors. For example, a pitch P3 of adjacent of the second coarse conductive connectors is similar to the pitch P2 of adjacent of the first coarse conductive connectors, as shown in FIG. 18 and FIG. 22. By doing so, the substrate may have further integration and application flexibility.

Referring to FIG. 19, similar to FIG. 4 to FIG. 7, the first unit 300A and the second unit 300B are connected. And then, the thermal compression bonding process is performed. Further, after performing the hot-pressing process, the first TGV unit 300A and the second TGV unit 300B are directly bonded to each other, therefore, the first TGV unit 300A is electrically connected to the second TGV unit 300B. In addition, the laser beam welding process is performed on the glass-to-glass bonding interface of the directly bonding interface 107. A structure of FIG. 19 is different from a structure of FIG. 7 in the following: the first coarse pitch portion 303AC are directly in contact with the second coarse pitch portion 303B and the fine pitch portion 303AF is exposed by the cavity 308.

After the above-mentioned manufacturing process, the manufacturing of a core layer 310 including the first TGV unit 300A and the second TGV unit 300B is substantially completed. Accordingly, the core layer 310 of the substrate assembling by two separated TGV units may have the high aspect ratio, such that the aspect ratio issue may be improve. As a result, it will have adverse effects on the yields and the electrical performance in subsequent applications of the substrate. Herein, the aspect ratio of the core layer 310 is the length of the conductive connector divided by the diameter of the conductive connector.

It should be noted that the above embodiments show the bonding implementation of multiple identical TGV units, as shown in FIG. 1 to FIG. 16, however, in other embodiment, a thickness and an internal circuit design of the TGV units mat be different, for example, a thickness of the first TGV unit 300A is less than a thickness of the second TGV unit 300B, as shown in FIG. 17 to FIG. 20.

Referring to FIG. 23, the first TGV unit 300A is configured to disposed a first chip 340 and the second TGV unit 300B is configured to disposed a second chip 350, and the first chip 340 is faced to the second chip 350. Further, a plurality of external terminals 360 are formed on the second TGV unit 300B. Herein, the second chip 350 may be memory, stacked memory, or vertical power supply module.

For example, the first chip 340 has different bumps 341, 342 including different pitches, and the different pitches may be corresponded to the fine pitch portion 303AF and the first coarse pitch portion 303AC. Moreover, the second chip 350 may be located in the cavity 308 and may be corresponded to the fine pitch portion 303AF, such that the first chip 340 is electrically connected to the second chip 350 through the fine pitch portion 303AF.

Referring to FIG. 24, similar to FIG. 23, a structure of FIG. 24 is different from a structure of FIG. 23 in the following: a first circuit structure 120 is formed between the first chip 340 and the first TGV unit 300A of the substrate.

Figure 25:
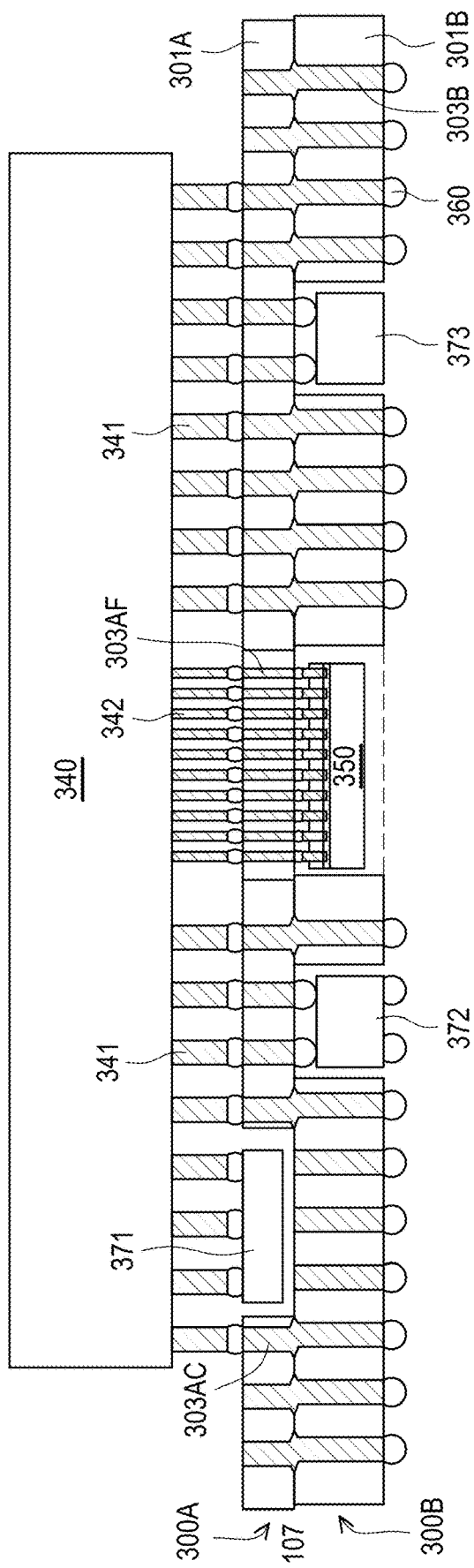

Referring to FIG. 25, similar to FIG. 23, a structure of FIG. 25 is different from a structure of FIG. 23 in the following: the first TGV unit 300A has another one cavity 308, and a first component 371 (such as capacitor or inductor) is disposed in the aforementioned cavity 308 in the first TGV unit 300A, wherein the first component 371 is electrically connected to the first chip 340. In addition, the second TGV unit 300B has another two cavities 308 in the second coarse pitch portion 303B, a second component 372 (such as integrated voltage regulator) and a third component 373 (such as Co-packaged optical module (CPO)) are disposed in the aforementioned cavity 308 respectively, wherein the second component 372 and the third component 373 are electrically connected to first coarse pitch portion 303AC respectively.

Figure 26:
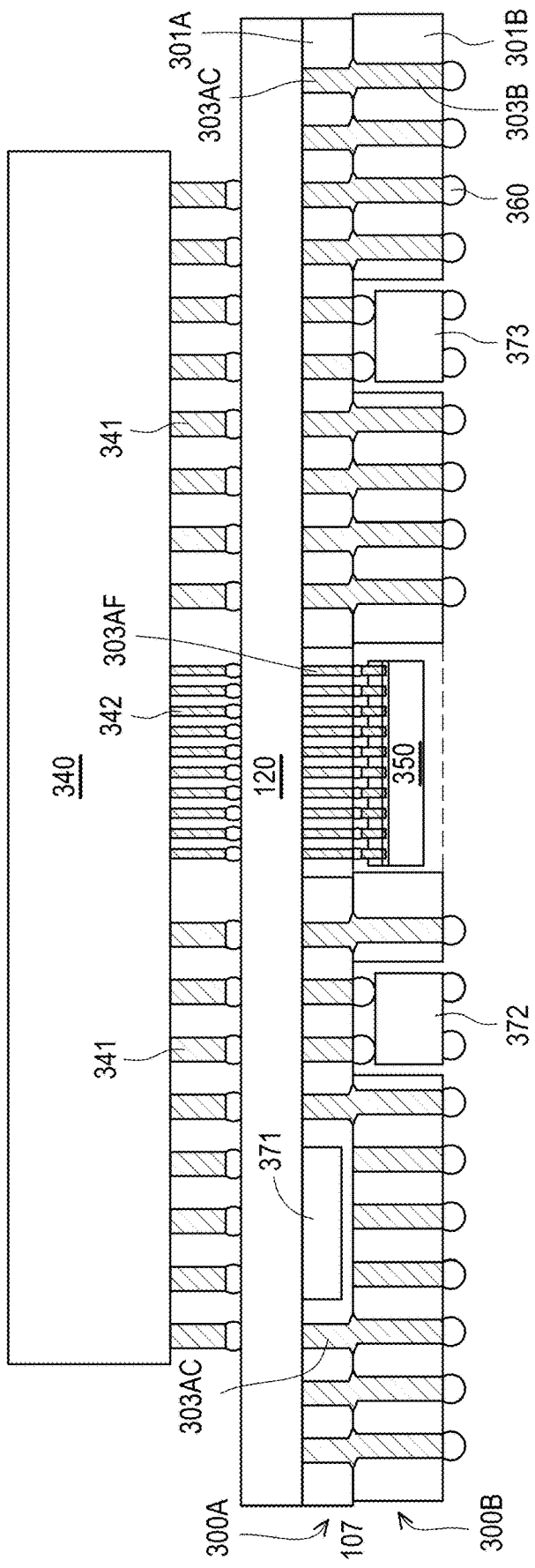

Referring to FIG. 26, similar to FIG. 25, a structure of FIG. 26 is different from a structure of FIG. 25 in the following: a first circuit structure 120 is formed between the first chip 340 and the first TGV unit 300A of the substrate.

Figure 27:
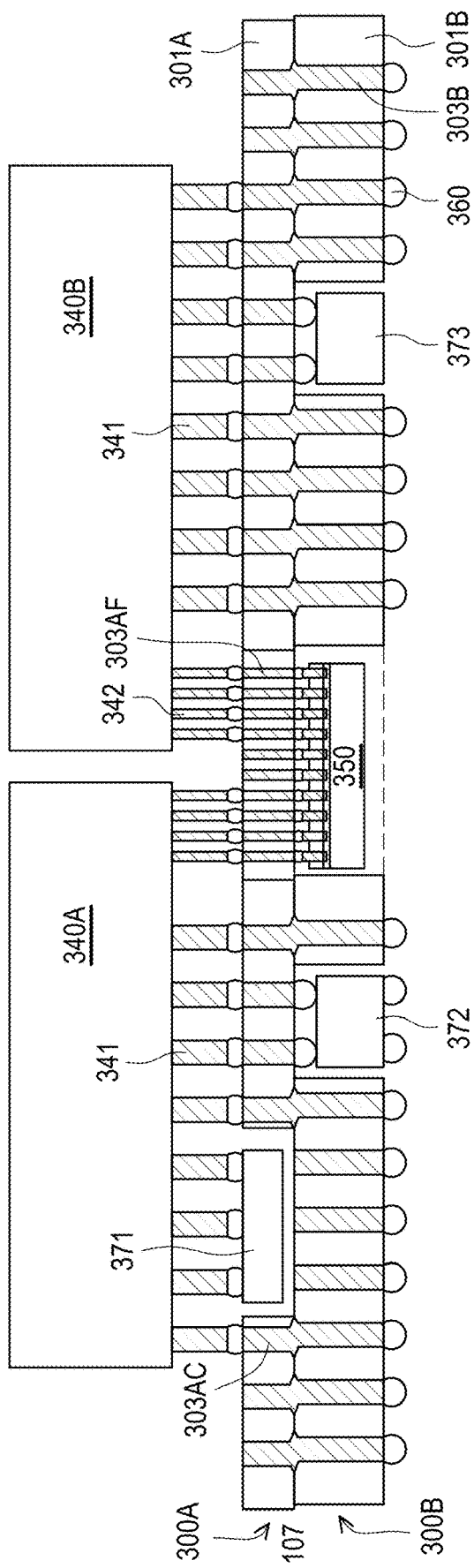

Referring to FIG. 27, similar to FIG. 25, a structure of FIG. 27 is different from a structure of FIG. 25 in the following: the first chip 340 may be replaced of two independent chips 340A, 340B. Further, the second chip 350 may be a bridge die 350 to connect the chips 340A, 340B, wherein in this situation, the bridge die 350 may be suitable passive device or active device. In the embodiment, the structure of FIG. 26 is bridge die-last solution.

Figure 28:
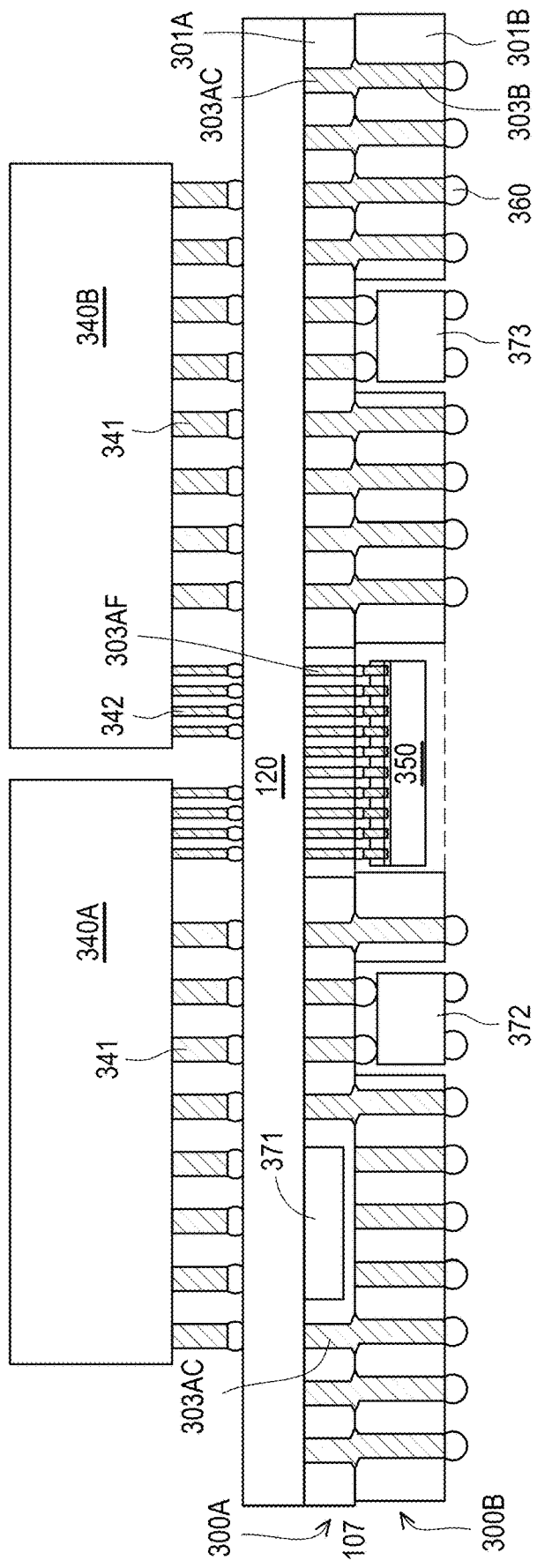

Referring to FIG. 28, similar to FIG. 27, a structure of FIG. 28 is different from a structure of FIG. 27 in the following: a first circuit structure 120 is formed between the chips 340A, 340B and the first TGV unit 300A of the substrate.

To sum up, in this disclosure, the core layer of the substrate assembling by two separated TGV units may have the high aspect ratio, such that the aspect ratio issue may be improve. As a result, it will have adverse effects on the yields and the electrical performance in subsequent applications of the substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A substrate, comprising:
    a first through glass via (TGV) unit comprising a plurality of first conductive connectors and a first glass layer penetrated through by the first conductive connectors; and
    a second TGV unit comprising a plurality of second conductive connectors and a second glass layer penetrated through by the second conductive connectors, wherein the second TGV unit is bonded to the first TGV unit, the first TGV unit is electrically connected to the second TGV unit, and a directly bonding interface including a glass-to-glass bonding interface and a metal-to-metal bonding interface is located between the first TGV unit and the second TGV unit,
    the directly bonding interface is configured by the first conductive connectors, the first glass layer, the second conductive connectors, and the second glass layer;
    each of the first conductive connectors comprises a first enlarged portion and a first pillar portion;
    each of the second conductive connectors comprises a second enlarged portion and a second pillar portion;
    the first glass layer is directly in contact with the second glass layer; and
    the first enlarged portions of the first conductive connectors are directly in contact with the second enlarged portions of the second conductive connectors.

2. The substrate according to claim 1, wherein the first TGV unit and the second TGV unit has alignment shift in an orthographic projection direction.

3. The substrate according to claim 1, wherein:
    the first enlarged portion is gradually increased in a direction toward the directly bonding interface; and
    the second enlarged portion is gradually increased in a direction toward the directly bonding interface.

4. The substrate according to claim 1, wherein the first pillar portion and the second pillar portion opposite to each other are not entirely overlapped.

5. The substrate according to claim 1, wherein a bonding area between the first TGV unit and the second TGV unit is larger than a diameter of the first pillar portion or a diameter of the second pillar portion.

6. The substrate according to claim 1, wherein:
    the first TGV unit comprises a fine pitch portion and a first coarse pitch portion;
    the second TGV unit comprises a second coarse pitch portion; and
    the first coarse pitch portion are directly in contact with the second coarse pitch portion.

7. The substrate according to claim 6, wherein a thickness of the first TGV unit is less than a thickness of the second TGV unit.

8. The substrate according to claim 6, wherein the second TGV unit comprises a cavity and the fine pitch portion is exposed by the cavity.

9. The substrate according to claim 1, wherein the first TGV unit and the second TGV unit are assembled to be a core layer of the substrate, and the substrate further comprising:
    a first circuit structure, disposed on a top surface of the core layer; and
    a second circuit structure, disposed on a bottom surface of the core layer.

10. The substrate according to claim 1, wherein one of the first TGV unit and the second TGV unit comprises a fine pitch portion and a first pitch portion.

11. The substrate according to claim 1, wherein one of the first TGV unit and the second TGV unit comprises a plurality of cavities.

12. The substrate according to claim 11, wherein the substrate further comprising: a bridge die disposed in one of the plurality of cavities.

13. A manufacturing method of a substrate, comprising:
providing a first through glass via (TGV) unit and a second TGV unit, wherein
the first TGV unit comprises a plurality of first conductive connectors and a first glass layer penetrated through by the first conductive connectors;
the second TGV unit comprises a plurality of second conductive connectors and a second glass layer penetrated through by the second conductive connectors;
connecting the first TGV unit and the second TGV unit; and
performing a thermal compression bonding process, such that the first TGV unit and the second TGV unit are directly bonded to each other, wherein
the directly bonding interface is configured by the first conductive connectors, the first glass layer, the second conductive connectors, and the second glass layer;
each of the first conductive connectors comprises a first enlarged portion and a first pillar portion;
each of the second conductive connectors comprises a second enlarged portion and a second pillar portion;
the first glass layer is directly in contact with the second glass layer; and
the first enlarged portions of the first conductive connectors are directly in contact with the second enlarged portions of the second conductive connectors.

14. The manufacturing method of substrate according to claim 13, wherein an operated temperature of the thermal compression bonding ranges from 250° C. to 500° C. and an operated pressure of the thermal compression bonding process ranges from 1 atm to 10 atm.

15. The manufacturing method of substrate according to claim 13, wherein an environment of the thermal compression bonding process is free of oxygen.

16. The manufacturing method of substrate according to claim 13, wherein before connecting the first TGV unit and the second TGV unit, the first TGV unit and the second TGV unit are entire through via type or partial through via type respectively.

17. The manufacturing method of substrate according to claim 13, wherein:
the first conductive connectors are protruded from the first glass layer toward to the second TGV unit during the thermal compression bonding process; and
the second conductive connectors are protruded from the second glass layer toward to the first TGV unit during the thermal compression bonding process.

18. The manufacturing method of substrate according to claim 17, wherein the first conductive connectors and the second conductive connectors are squeezed and flowed to a surface of the first glass layer and a surface of the second glass layer during the thermal compression bonding process.

19. The manufacturing method of substrate according to claim 17, wherein after performing the thermal compression bonding process, a laser beam welding process is performed on a bonding interface between the first glass layer and the second glass layer.

20. The manufacturing method of substrate according to claim 17, wherein before connecting the first TGV unit and the second TGV unit, a planarization process is performed on the first TGV unit and the second TGV unit respectively.

21. The manufacturing method of substrate according to claim 17, wherein the first conductive connectors and the second conductive connectors are not entirely aligned during the thermal compression bonding process.

* * * * *